(12) United States Patent
Lee et al.

(10) Patent No.: US 6,800,530 B2
(45) Date of Patent: Oct. 5, 2004

(54) TRIPLE LAYER HARD MASK FOR GATE PATTERNING TO FABRICATE SCALED CMOS TRANSISTORS

(75) Inventors: Byoung Hun Lee, Wappingers Falls, NY (US); Bachir Dirahoui, Bedford Hills, NY (US); Effendi Leobandung, Wappingers Falls, NY (US); Tai-Chi Su, Woodbury, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/342,420

(22) Filed: Jan. 14, 2003

(65) Prior Publication Data

US 2004/0137672 A1 Jul. 15, 2004

(51) Int. Cl.$^7$ ............................................. H01L 21/336
(52) U.S. Cl. .................................... 438/301; 438/300
(58) Field of Search ................................ 438/301, 300

(56) References Cited

U.S. PATENT DOCUMENTS

| | | | |
|---|---|---|---|
| 5,397,909 A | * 3/1995 | Moslehi | 257/383 |
| 5,665,631 A | 9/1997 | Lee et al. | |
| 5,908,672 A | 6/1999 | Ryu et al. | |
| 5,949,105 A | * 9/1999 | Moslehi | 257/336 |
| 5,955,759 A | * 9/1999 | Ismail et al. | 257/332 |
| 6,033,963 A | * 3/2000 | Huang et al. | 438/303 |
| 6,069,380 A | 5/2000 | Chou et al. | |
| 6,083,836 A | 7/2000 | Rodder | |
| 6,177,303 B1 | * 1/2001 | Schmitz et al. | 438/194 |
| 6,180,486 B1 | 1/2001 | Leobandung et al. | |
| 6,188,122 B1 | 2/2001 | Davari et al. | |
| 6,214,694 B1 | 4/2001 | Leobandung et al. | |
| 6,238,998 B1 | 5/2001 | Leobandung | |
| 6,251,763 B1 | * 6/2001 | Inumiya et al. | 438/595 |
| 6,287,938 B2 | 9/2001 | Lee at al. | |
| 6,297,153 B1 | 10/2001 | Park et al. | |
| 6,333,247 B1 | 12/2001 | Chan et al | |
| 6,365,474 B1 | * 4/2002 | Finder et al. | 438/305 |
| 6,372,649 B1 | 4/2002 | Han et al. | |
| 6,429,488 B2 | 8/2002 | Leobandung et al. | |
| 6,479,345 B2 | 11/2002 | Ahn et al. | |
| 6,483,156 B1 | 11/2002 | Adkisson et al. | |
| 6,495,437 B1 | * 12/2002 | Yu | 438/591 |
| 6,521,947 B1 | 2/2003 | Ajmera et al. | |
| 6,551,885 B1 | * 4/2003 | Yu | 438/300 |
| 6,569,782 B2 | 5/2003 | Jeon et al. | |
| 6,602,753 B2 | 8/2003 | Koyama et al. | |
| 6,635,517 B2 | 10/2003 | Chen et al. | |
| 6,649,460 B2 | 11/2003 | Leobandung | |
| 6,653,698 B2 | 11/2003 | Lee et al. | |
| 6,660,596 B2 | 12/2003 | Adkisson et al. | |
| 6,664,150 B2 | * 12/2003 | Clark et al. | 438/154 |
| 6,699,625 B2 | 3/2004 | Lee et al. | |
| 2001/0005615 A1 | 6/2001 | Lee et al. | |
| 2001/0008292 A1 | 7/2001 | Leobandung et al. | |
| 2001/0049183 A1 | 12/2001 | Henson et al. | |
| 2001/0054766 A1 | 12/2001 | Dirahoui et al. | |
| 2002/0045108 A1 | 4/2002 | Lee at al. | |
| 2002/0153587 A1 | 10/2002 | Adkisson et al. | |
| 2002/0177273 A1 | 11/2002 | Lee et al. | |
| 2003/0032251 A1 | 2/2003 | Chen et al. | |
| 2003/0047755 A1 | 3/2003 | Lee et al. | |
| 2003/0082872 A1 | 5/2003 | Leobandung | |
| 2003/0118616 A1 | 6/2003 | Lee et al. | |
| 2003/0119292 A1 | 6/2003 | Lee et al. | |
| 2003/0198874 A1 | 10/2003 | Lee | |
| 2004/0029352 A1 | 2/2004 | Beyer et al. | |
| 2004/0038839 A1 | 2/2004 | Kim et al. | |
| 2004/0057611 A1 | 3/2004 | Lee et al. | |
| 2004/0082171 A1 | 4/2004 | Shin et al. | |

* cited by examiner

Primary Examiner—Matthew Smith
Assistant Examiner—Chuong Anh Luu

(57) ABSTRACT

An integrated circuit employing CMOS technology employs a process integration that combines a source/drain silicide with a replacement gate process using a triple layer hardmask that is consumed during the course of processing in which a first temporary gate sidewall spacer defines an area for the formation of the raised source and drain and a second temporary spacer defines an area for the implant of the source and drain and for the siliciding of the source and drain while the temporary gate is protected from silicidaiton by the hardmask.

16 Claims, 2 Drawing Sheets

TRIPLE LAYER HARD MASK FOR GATE PATTERNING TO FABRICATE SCALED CMOS TRANSISTORS

TECHNICAL FIELD

The field of the invention is that of CMOS processing, in particular integration of the process for fabricating integrated circuits.

BACKGROUND OF THE INVENTION

As dimensions shrink in integrated circuit processing, vertical dimensions shrink as well as transverse ones—i.e. the layers that make up the integrated circuit become thinner.

The result of this is that various steps that were straightforward in larger-dimension processing become more difficult.

For example, the dimensions of devices in the near future are expected be less than 110 nm and the gate dielectric in a field effect transistor is expected to be of material having a higher dielectric constant than silicon dioxide (SiO2, oxide). Unfortunately, such materials are less thermally stable than oxide, so that the permissible exposure of the device to high temperatures is even more limited than it is with oxide gate insulators.

It is nevertheless necessary to expose the wafer, and thus the materials within the transistors, to temperatures in excess of one thousand degrees Centigrade in order to activate the source and drain diffusions of the transistors. Most high-k dielectrics can not withstand exposure to such temperatures for the durations required.

Further, the use of metal gates (e.g. Tungsten, Tantalum Silicon Nitride (TaSiN), Tantalum Nitride (TaN)) is accepted as being necessary for adequate transistor performance.

Such gates require a sacrificial gate process, independently of whether the gate dielectric does. In a sacrificial gate process, the transistor is constructed with a dummy, or sacrificial, gate during the steps such as providing alignment of the sources and drains with the gate structure. After activating the source and drain, the sacrificial gate material is removed and the high-k gate dielectric and/or the metal gate material are deposited.

Those skilled in the art are aware that no removal process is one hundred percent efficient, and there will inevitably be removal of extra material, so that the final dimensions of the gate will not be exactly as desired.

In addition, in the case of silicon on insulator wafers, the thickness of the silicon device layer decreases, and there is not enough material in the thickness of the layer to be consumed (e.g. less than about 50 nm of silicon) in the process of forming a silicide for higher conductivity and better performance.

Those skilled in the art are aware that raised sources and drains provide extra thickness only in the sources and drains, while retaining the desired dimension elsewhere.

Although various aspects of the foregoing considerations are known to those skilled in the art, there remains a considerable problem of process integration to make all the process steps produce the desired final result.

It is not enough to combine a step from one solution to a given problem with a step from another solution to another problem if the different steps are mutually exclusive or otherwise conflict.

In integrated circuit processing at the 70 nm node, it is accepted in the art that a sacrificial gate process is necessary. In such a process, the transistor structure is formed

SUMMARY OF THE INVENTION

The invention relates to a process for forming a CMOS transistor in a silicon on insulator wafer that combines a sacrificial gate process with a raised source and drain.

In one embodiment of the invention, a three layer hardmask protects the gate stack during subsequent processing.

In one embodiment of the invention, two disposable spacers are used to define the area for the raised source/drain and to block an ion implant into the raised source/drain.

In another embodiment of the invention, the hard mask prevents the formation of silicide on the top of the gate stack.

DETAILED DESCRIPTION

Figure 1:
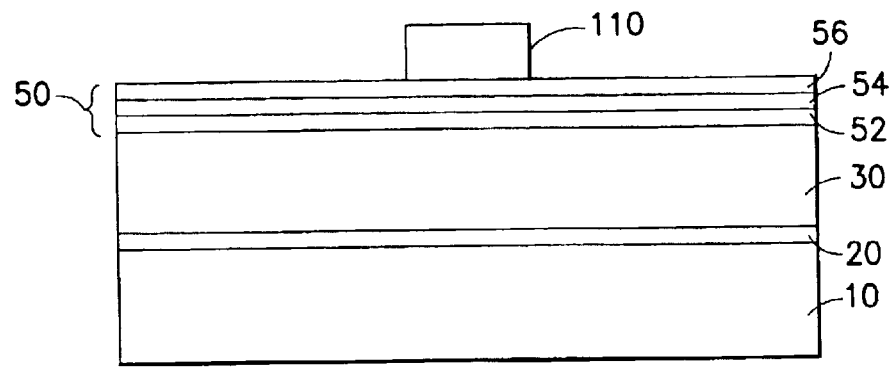
FIG. 1 illustrates in cross section a CMOS transistor being formed in a SOI wafer, at a preliminary stage in the process.

FIG. 1 illustrates in cross section a CMOS transistor being formed in a wafer, which may be either SOI or bulk silicon) at a preliminary stage in the process. At the stage shown, silicon substrate 10 has a gate oxide layer 20 formed on it, with a blanket layer of polycrystalline silicon (poly) 30 on top of that. Oxide 20 will be removed in this area, but is a thermal oxide that may be used as a gate oxide in other portions of the integrated circuit. Poly layer 30 will be used to form the sacrificial gate in this process.

Above poly layer 30, there is a hard mask layer 50, comprising sublayers of silicon nitride (Si3N4-nitride) 52 (30 nm thick), oxide 54 (15 nm thick), and a second or upper layer of nitride (30 nm thick). Block 110 represents a patterned photoresist or other etch mask that defines the width of the gate stack in the following gate etch.

In this application, the Nitride/Oxide/Nitride stack layer is used as a hard mask for the polysilicon gate. This structure allows raised source/drain formation prior to formation of the LDD extension of the source and drain step and effectively blocks forming silicide during that step of the conventional CMOS process.

Figure 2:
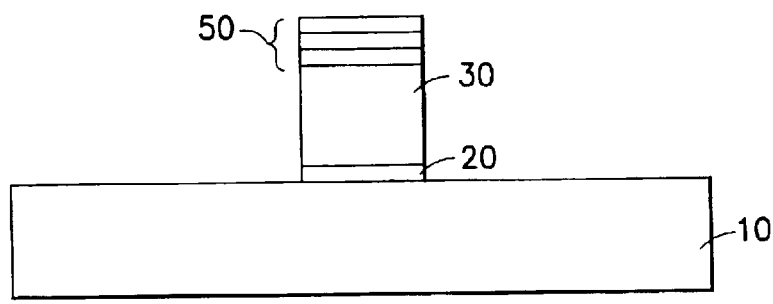
FIG. 2 illustrates the same area after the gate stack has been patterned.

FIG. 2 shows the gate stack after the directional patterning etch, illustratively a reactive ion etch, which has used appropriate chemistry, changing it as necessary to remove all of the hardmask 50 and then, using the top nitride layer 56 of the hard mask for definition, to pattern the poly layer 30 and the gate oxide 20 by removing those portions of the poly and oxide layers outside the gate stack, stopping on substrate 10.

Figure 3:
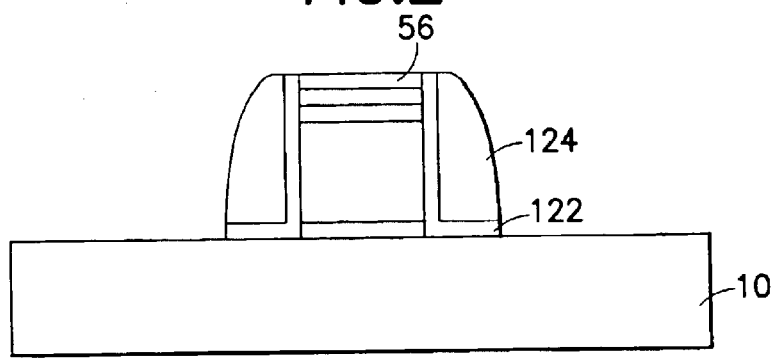
FIG. 3 illustrates the same area after forming temporary sidewalls.

FIG. 3 shows the result of forming a conformal layer of oxide 122 that encapsulates the gate stack. This layer of oxide protects the gate stack during the formation of disposable nitride spacer 124, which is used in a subsequent step of forming a raised source and drain. After the deposition of the layer that forms spacers 124 (nominally 30 nm of nitride), a directional etch removes the horizontal portions of the nitride in layer 124 and also the oxide in layer 122. The structure shown in this figure will be referred to as the expanded stack. The structure of hardmask 50 is unchanged, as the oxide layer 122 on the top of hardmask 50 has been removed during the process of spacer definition.

Figure 4:
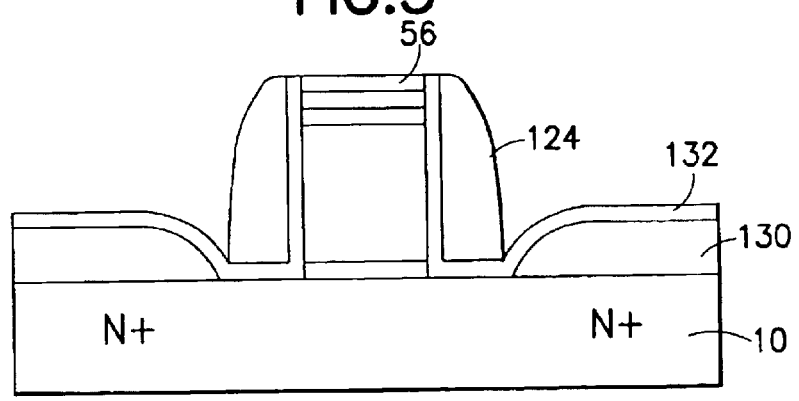
FIG. 4 illustrates the same area after forming the raised sources and drains.

FIG. 4 shows the area after a process of epitaxial deposition of silicon to form raised source and drain layers 130. Illustratively, silicon 130 is grown in a selective process that increases the thickness only where silicon is exposed; i.e. in which the silicon does not adhere to nitride or oxide. The silicon formation is followed by growth of a thin layer of thermal oxide 132 that protects the new source/drain extension during the subsequent nitride strip.

Figure 5:
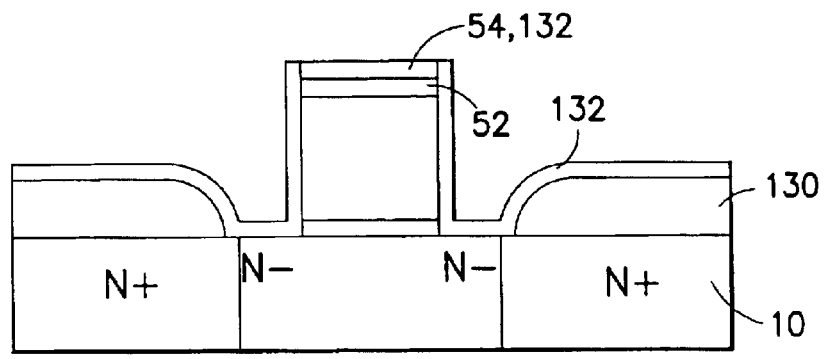
FIG. 5 illustrates the same area after stripping the temporary sidewalls and implanting the lightly doped portions of the sources and drains.

Referring now to FIG. 5, nitride spacer 124 has been removed, exposing an area adjacent to the expanded gate stack that will be implanted to form the LDD source/drain extension. Advantageously, the vertical portion of oxide layer 122 that was between spacers 124 and the gate stack protects the bottom nitride 52 of hardmask 50 during the nitride stripping step. The remaining portion of oxide 122 that was underneath spacer 124 has been removed in a directional etch that does not substantially attack oxide layer 54 in the hardmask.

The LDD implant, in this case $N^-$, is made adjacent to the gate stack.

Figure 6:
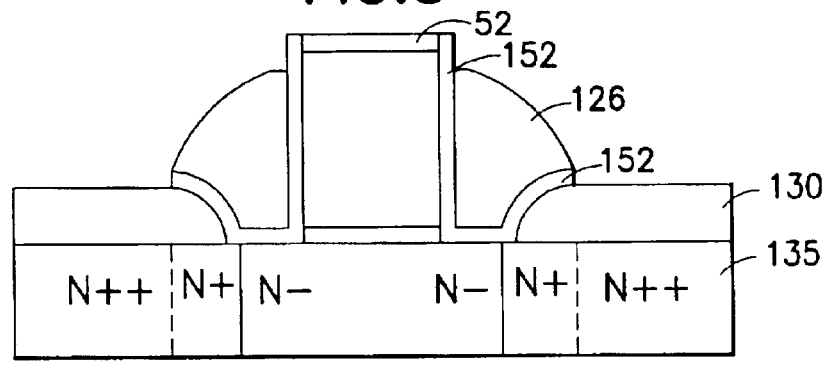
FIG. 6 illustrates the same area after encapsulating the gate stack with nitride and depositing the final sidewalls.

FIG. 6 shows the area after the deposition of a thin layer of nitride 152 on top of the earlier hardmask layer 52 and extending horizontally, and formation of a second spacer 126 of oxide. Nitride 152 is stripped over the source and drain, in a process that preserves enough nitride 52 over the top of the gate stack to block silicide formation there. A silicidation process forms a silicide 137 on the raised source and drain, but not on the top of the gate stack. This protection from silicidation by bottom nitride 52 permits easier removal of the gate stack in the later step of removing the gate.

In the case where the wafer is a silicon on insulator wafer, whether bonded or implanted, similar considerations to those that drive those skilled in the art to shrink device dimensions also drive a reduction in thickness. In particular, fully depleted devices benefit from a reduction in the the thickness of the silicon device layer in which the bodies of transistors are formed. When the device layer becomes too thin, however, being less than about 50 nm in contemporary technology, the amount of silicon in the area of the wafer that is the source and/or drain is not sufficient to form a silicide film having sufficent thickness to be acceptable. In such a case, the addition of a step of raising the source and drain by depositing additional silicon in that area is beneficial. In the case of a wafer or circuit using SiGe technology, the additional raised source and drain may be SiGe, but does not need to be.

A second source/drain implant dose implants the raised source/drain and increases the doping of the lower $N^+$ portion of the source/drain to the conventional concentration of $N^{++}$. Spacers 126 block this implant over the inner area labeled $N^-$ and the intermediate area that has been implanted $N^+$, producing an implant gradation from $N^-$ adjacent to the gate stack, increasing to $N^+$ in the next region and then to $N^{++}$ under the silicide. Such a three-step process is preferred, but not necessary and the conventional two-step gradation of the lightly doped LDD region and the heavily doped source and drain may also be used.

Figure 7:
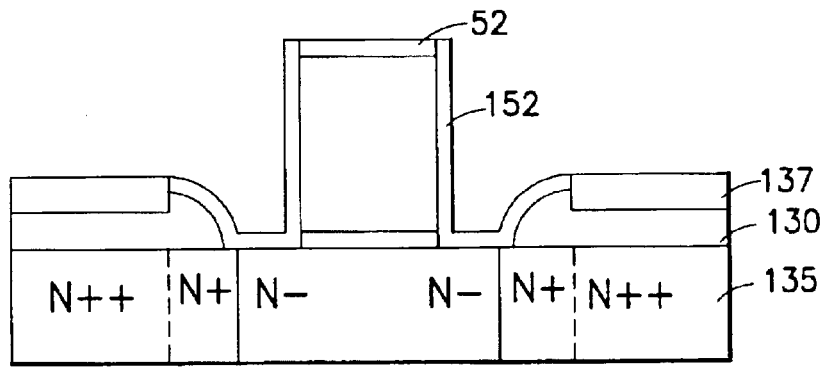
FIG. 7 illustrates the area after forming a planarizing layer and cmp.
Figure 8:
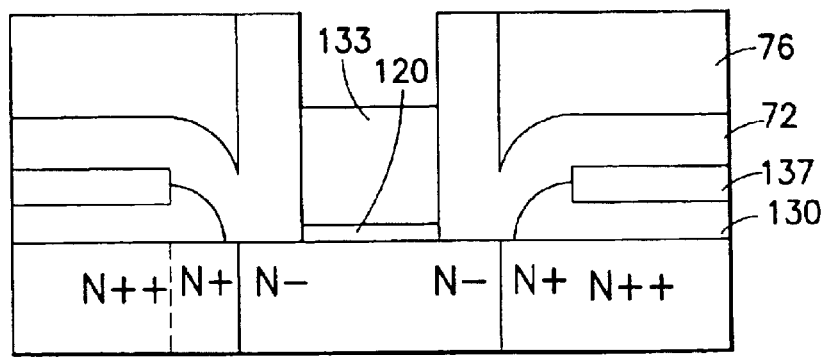
FIG. 8 illustrates the area after removal of the sacrificial gate.

As shown in FIG. 7, the oxide spacer 126 (and the intermediate layer 54 of the hardmask) is stripped, leaving nitride 152 over the gate stack. A thermnal treatment to activate the implanted dopants may be performed at any convenient time after the $N^{++}$ implant and before the final gate dielectric and gate are put down.

A blanket deposition of a relatively thick layer of nitride 72 for an etch stop and oxide 76, for isolation of the conductive members in the local interconnect, forms a thick layer that is reduced by conventional chemical-mechanical polishing (CMP) to the level of the top of the gate stack. The final layer 52 of the hardmask may be polished away during this step, illustratively in a process that uses the exposure of poly 30 in the temporary gate as a signal to stop the polishing. If such a process is not used, the remaining portion of layer 52/152 is stripped, exposing the poly 30 in the gate.

A poly etch removes gate 30, leaving an aperture lined with layer 152. Layer 152 may be left in place or stripped. The last removal step is an oxide etch to remove the sacrificial gate oxide 20. Optionally, if the design calls for a final gate dielectric of oxide, the stripping of the gate oxide may be omitted. A new gate dielectric, which may be a high-k material such as Hafnium Silicon Nitride (HFiSN), Hafnlium Oxygen Nitride (HfON) or Hafnium oxide (HfO2) or any other suitable material, is put down and a new gate is deposited. The new gate may be chosen from a number of alternatives, such as Tungsten, Tantalum Silicon Nitride (TaSiN), Tantalum Nitride (TaN). The residue of the two foregoing steps is removed from the top of layer 76, for example by chemical-mechanical polishing. The new gate may preferably fill the aperture left by the old gate, though that is not required. It may be preferable in some circumstances to fill the aperture partially and use the remaining space for a contact.

This process is applied to CMOS transistors of both polarities, NFETs and PFETS. The substrate 10 can be bulk silicon, SiGe and/or SO, with or without a SiGe top layer.

While the invention has been described in terms of a single preferred embodiment, those skilled in the art will recognize that the invention can be practiced in various versions within the spirit and scope of the following claims.

What is claimed is:

1. A method of forming a integrated circuit comprising at least one field effect transistor comprising the steps of:

preparing a semiconductor substrate;

forming a first dielectric layer on said substrate;

forming a sacrificial gate layer above said first dielectric layer, forming a hardmask layer, comprising at least two hardmask sublayers, above said sacrificial gate layer, forming a gate stack by patterning said hardmask layer, sacrificial gate layer and first dielectric layer;

forming fist protective sidewalls about said gate stack;

forming a raised source/drain structure outside said first protective sidewalls;

implanting source/drain extensions within said raised source/drain structure;

forming silicide over said raised source/drain structure while said gate stack is covered by said hardmask;

forming isolation dielectric, planarized to the level of said gate stack, about said gate stack;

removing said sacrificial gate layer within said gate stack, thereby forming a gate aperture;

removing said first dielectric layer in said gate aperture;

depositing a final gate dielectric in said gate aperture; and depositing a final gate layer in said gate aperture.

2. A method according to claim 1, in which:

said hardmask comprises a top layer of nitride and a layer of oxide below said top layer of nitride;

said first protective sidewalls are composed of nitride;

said first protective sidewalls and said top layer of nitride are removed after said step of forming said raised source/drain structure; and a step of oxide removal is performed before said step of siliciding that cleans said raised source/drain structure and simultaneously removes said oxide hardmask layer.

3. A method according to claim 1, in which:

a step of removing said first protective sidewalls and said top layer of nitride is performed before said step of implanting said source/drain extensions.

4. A method according to claim 1, in which:

a step of forming second protective gate sidewalls is performed after said step of implanting said source/drain extensions, which second protective gate sidewalls extend out to fill the area over said source/drain extensions, whereby said second protective gate sidewalls define the area for said silicide.

5. A method according to claim 2, in which:

a step of forming second protective gate sidewalls is performed after said step of implanting said source/drain extensions, which second protective gate sidewalls extend out to fill the area over said source/drain extensions, whereby said second protective gate sidewalls define the area for said silicide.

6. A method according to claim 3, in which:

a step of forming second protective gate sidewalls is performed after said step of implanting said source/drain extensions, which second protective gate sidewalls extend out to fill the area over said source/drain extensions, whereby said second protective gate sidewalls define the area for said silicide.

7. A method according to claim 1, in which:

a conformal oxide layer is formed that encapsulates said gate stack before said step of forming said first protective gate sidewalls.

8. A method according to claim 2, in which:

a conformal oxide layer is formed that encapsulates said gate stack before said step of forming said first protective gate sidewalls.

9. A method according to claim 3, in which:

a conformal oxide layer is formed that encapsulates said gate stack before said step of forming said first protective gate sidewalls.

10. A method according to claim 4, in which:

a conformal oxide layer is formed that encapsulates said gate stack before said step of forming said first protective gate sidewalls.

11. A method according to claim 4, in which:

a conformal nitride layer is formed that encapsulates said gate stack before said step of forming said second protective gate sidewalls.

12. A method according to claim 5, in which:

a conformal nitride layer is formed that encapsulates said gate stack before said step of forming said second protective gate sidewalls.

13. A method according to claim 6, in which:

a conformal nitride layer is formed that encapsulates said gate stack before said step of forming said second protective gate sidewalls.

14. A method according to claim 4, in which:

said oxide layer in said hardmask is removed when said second protective gate sidewalls are removed.

15. A method according to claim 5, in which:

said oxide layer in said hardmask is removed when said second protective gate sidewalls are removed.

16. A method according to claim 6, in which:

said oxide layer in said hardmask is removed when said second protective gate sidewalls are removed.

* * * * *